(12) United States Patent
Kautzsch et al.

(10) Patent No.: US 10,544,037 B2
(45) Date of Patent: Jan. 28, 2020

(54) INTEGRATED SEMICONDUCTOR DEVICE AND MANUFACTURING METHOD

(71) Applicant: Infineon Technologies Dresden GmbH, Dresden (DE)

(72) Inventors: Thoralf Kautzsch, Dresden (DE); Heiko Froehlich, Radebeul (DE); Alessia Scire, Dresden (DE); Maik Stegemann, Pesterwitz (DE); Bernhard Winkler, Regensburg (DE); Andre Roeth, Dresden (DE); Steffen Bieselt, Wehlen (DE); Mirko Vogt, Dresden (DE)

(73) Assignee: Infineon Technologies Dresden GmbH, Dresden (DE)

( * ) Notice: Subject to any disclaimer, the term of this patent is extended or adjusted under 35 U.S.C. 154(b) by 94 days.

(21) Appl. No.: 15/875,068

(22) Filed: Jan. 19, 2018

(65) Prior Publication Data

US 2018/0155188 A1 Jun. 7, 2018

Related U.S. Application Data

(62) Division of application No. 15/208,975, filed on Jul. 13, 2016, now Pat. No. 9,896,329.

(30) Foreign Application Priority Data

Jul. 17, 2015 (DE) .................. 10 2015 111 676
Apr. 15, 2016 (DE) .................. 10 2016 107 059

(51) Int. Cl.
*B81C 1/00* (2006.01)
*B81B 3/00* (2006.01)

(52) U.S. Cl.
CPC .......... *B81C 1/0015* (2013.01); *B81B 3/0078* (2013.01); *B81B 2201/0235* (2013.01);
(Continued)

(58) Field of Classification Search
CPC .......................... B81C 1/0015; B81C 3/0078
See application file for complete search history.

(56) References Cited

U.S. PATENT DOCUMENTS 6,862,921 B2 3/2005 Chand et al.
7,430,909 B2 10/2008 Adams et al.
(Continued)

FOREIGN PATENT DOCUMENTS

DE 10100438 A1 7/2002

OTHER PUBLICATIONS

Sato et al. Fabrication of Silicon-on-Nothing Structure by Substrate Engineering Using the Empty-Space-in-Silicon Formation Technique. Japanese Journal of Applied Physics. vol. 43, No. 1, 2004, pp. 12-18.

(Continued)

*Primary Examiner* — Nathan W Ha
(74) *Attorney, Agent, or Firm* — Eschweiler & Potashnik, LLC

(57) ABSTRACT

The present disclosure relates to an integrated semiconductor device, comprising a semiconductor substrate; a cavity formed into the semiconductor substrate; a sensor portion of the semiconductor substrate deflectably suspended in the cavity at one side of the cavity via a suspension portion of the semiconductor substrate interconnecting the semiconductor substrate and the sensor portion thereof, wherein an extension of the suspension portion along the side of the cavity is smaller than an extension of said side of the cavity.

19 Claims, 8 Drawing Sheets

(52) U.S. Cl.
CPC ............... *B81B 2203/0118* (2013.01); *B81B 2203/0163* (2013.01)

(56) References Cited

U.S. PATENT DOCUMENTS

| | | | |
|---|---|---|---|
| 7,861,316 B2* | 12/2010 | van der Weide | B82Y 35/00 850/21 |
| 8,921,974 B2 | 12/2014 | Kautzsch et al. | |
| 2002/0135033 A1 | 9/2002 | Hara et al. | |
| 2004/0020173 A1* | 2/2004 | Cho | A61K 9/0009 53/487 |
| 2004/0122328 A1* | 6/2004 | Wang | A61B 1/00048 600/476 |
| 2004/0152211 A1 | 8/2004 | Majumdar et al. | |
| 2004/0177689 A1* | 9/2004 | Cho | G01C 19/5719 73/504.14 |
| 2005/0021247 A1* | 1/2005 | Liu | G01F 1/28 702/42 |
| 2005/0076719 A1 | 4/2005 | Jakobsen et al. | |
| 2008/0100176 A1 | 5/2008 | Haskell et al. | |
| 2008/0175281 A1* | 7/2008 | Nakamura | H01S 5/141 372/20 |
| 2013/0307096 A1 | 11/2013 | Classen et al. | |
| 2015/0162253 A1 | 6/2015 | Bieselt | |
| 2018/0033809 A1* | 2/2018 | Tayanaka | H01L 27/14 |

OTHER PUBLICATIONS

Notice of Allowance dated Oct. 12, 2017 for U.S. Appl. No. 15/208,975.
Non-Final Office Action dated May 24, 2017 for U.S. Appl. No. 15/208,975.

\* cited by examiner (a)

(b)

(c)

Outer trench region aligned at curved SON cavity region

INTEGRATED SEMICONDUCTOR DEVICE AND MANUFACTURING METHOD

CROSS REFERENCE TO RELATED APPLICATIONS

This application is a Divisional Application of U.S. application Ser. No. 15/208,975 filed on Jul. 13, 2016, which claims priority to German Application number 10 2015 111 676.6 filed on Jul. 17, 2015 and German Application number 10 2016 107 059.9 filed on Apr. 15, 2016, the contents of which are herein incorporated by reference in its entirety.

FIELD

Embodiments generally relate to semiconductor devices and methods for manufacturing semiconductor devices, and, more particularly, to integrated sensor devices and related manufacturing methods.

BACKGROUND

Electronic sensors generally measure a physical quantity and convert the measured physical quantity into a signal that is provided to an electronic instrument (e.g., integrated chip processor). In recent years, the number of areas using sensors has vastly expanded. For example, sensors can be found in diverse applications such as chemical agent detection units, medical diagnostic equipment, industrial process controls, pollution monitoring, automobiles, etc.

Semiconductor based integrated sensors, such as acceleration or pressure sensors, for example, are available as mass products in automotive and consumer goods electronics. Here, among other things, Micro-Electro-Mechanical Systems (MEMS) are desirable, which integrate a simple threshold switch in an Application Specific Integrated Circuit (ASIC).

When migrating to newer semiconductor process technologies, one challenge is to integrate MEMS such that the complexity of CMOS (Complementary Metal-Oxide-Semiconductor) processes is not unnecessarily increased and existing CMOS integration schemes can be largely retained with minimal development effort. For sub 130 nm process technologies, for example, topology of frontend-of-line structures plays an important role. They should not exceed a total thickness of a few hundred nanometers, so as not to interfere a potential Borophosphosilicate glass (BPSG) polishing act. Furthermore, a reduction to possibly few extra acts and the joint use of existing processes is a prerequisite for successful integration.

Another challenge is the interaction between housing and sensor. In the field of capacitive sensors, the capacitor elements may be subject to considerable stress—depending on the housing type. Often special housings are used which contribute a significant cost component in the overall system.

It is therefore desirable to provide improved microelectromechanical sensor systems taking into account the above mentioned issues.

SUMMARY

An embodiment of the present disclosure relates to an integrated semiconductor device. The integrated semiconductor device comprises a semiconductor substrate and a cavity formed into the semiconductor substrate. Further, the integrated semiconductor device comprises a sensor portion of the semiconductor substrate, the sensor portion being deflectably suspended in the cavity at one side of the cavity via a suspension portion of the semiconductor substrate interconnecting the semiconductor substrate and the sensor portion thereof. An extension of the suspension portion along the side of the cavity is smaller than an extension of said side of the cavity.

In some embodiments, the sensor portion and the suspension portion are continuous portions of the semiconductor substrate. That is to say, the sensor portion, the suspension portion, and the semiconductor substrate may be formed monolithically as one piece.

In some embodiments, the sensor portion of the semiconductor substrate is configured for an out-of-plane deflection relative to a surface of the semiconductor substrate in response to an out-of-plane excitation applied to the integrated semiconductor device.

In some embodiments, the suspension portion is a single strip of semiconductor material integrally or monolithically interconnecting the semiconductor substrate and the sensor portion thereof. An extension of the suspension portion along the side of the cavity may hence be smaller than an extension of the sensor portion along said side of the cavity.

In some embodiments, the sensor portion of the semiconductor substrate may have a width of more than 100 µm and a length of more than 100 µm.

In some embodiments, the suspension portion is at least partially coated with a stress layer configured to apply an offset tensile or compressive stress or strain to the sensor portion of the semiconductor substrate. The stress layer may comprise a material with a different lattice constant and/or a different coefficient of thermal expansion than that of the substrate's semiconductor material (for example Silicon, Si). An example material for the stress layer would be silicon nitride ($Si_3N_4$).

In some embodiments, the integrated semiconductor device is or comprises an accelerometer. Here, the sensor portion of the semiconductor substrate constitutes a proof mass configured for an out-of-plane movement in response to an out-of-plane acceleration of the integrated semiconductor device.

In some embodiments, the integrated semiconductor device further comprises a frame structure formed into the semiconductor substrate such that the frame structure surrounds the sensor portion. The frame structure is suspended in the cavity laterally between an edge of the sensor portion and an edge of the cavity. The frame structure and the sensor portion are separated by a first gap, the frame structure and the edge of the cavity are separated by a second gap.

In some embodiments related to accelerometers, the sensor portion is a proof mass and comprises a first plurality of comb tines formed into at least one edge of the proof mass. The frame structure comprises second plurality of comb tines arranged interleaved with the first plurality of comb tines.

In some embodiments, the sensor portion, the frame structure, and the semiconductor substrate are integrally or monolithically formed from one piece of semiconductor material. The sensor portion and the frame structure are suspended in the cavity via a common single suspension portion of the semiconductor substrate integrally or monolithically interconnecting the semiconductor substrate, the frame structure, and the sensor portion of the semiconductor substrate. Consequently, the sensor portion, the frame structure, the suspension portion, and the semiconductor substrate may be monolithically formed from one piece of semiconductor material.

In some embodiments, the sensor portion comprises, at an end of the sensor portion merging into the suspension portion, a trench extending substantially parallel to an edge of the sensor portion facing the suspension portion of the semiconductor substrate. A distance between the trench and the edge is dependent on the size and mass of the sensor portion. In some embodiments, it may be less than 10 μm.

In some embodiments, the sensor portion of the semiconductor substrate is a membrane configured for an out-of-plane oscillation in response to an out-of-plane pressure applied to the integrated semiconductor device. This may be useful for MEMS microphone applications, for example.

According to a further aspect, the present disclosure provides an integrated semiconductor device. The integrated semiconductor device comprises a semiconductor substrate, a cavity formed into the semiconductor substrate, a continuous sensor portion of the semiconductor substrate deflectably suspended in the cavity at a single side of the cavity via a continuous single suspension strip of the semiconductor substrate integrally interconnecting the semiconductor substrate and the sensor portion thereof, wherein an extension of the suspension strip along the side of the cavity is smaller than an extension of said side of the cavity. The integrated semiconductor device further includes a continuous frame portion of the semiconductor substrate, the frame portion surrounding the sensor portion of the semiconductor substrate. The frame portion is suspended in the cavity, via the suspension strip, laterally between an edge of the sensor portion and an edge of the cavity. The frame portion and the sensor portion are separated by a first gap, and the frame portion and the edge of the cavity are separated by a second gap. The semiconductor substrate, the sensor portion, the suspension strip, the frame portion may constitute one continuous piece. That is, they may be formed monolithically.

According to yet a further aspect, the present disclosure also provides a method for manufacturing an integrated semiconductor device. The method includes forming, in a semiconductor substrate, a cavity extending below a sensor portion of the semiconductor substrate, and forming, at one side of the cavity, a suspension portion of the semiconductor substrate deflectably suspending the sensor portion in the cavity, such that an extension of the suspension portion along the side of the cavity is smaller than an extension of said side of the cavity.

In some embodiments, forming the cavity comprises using a Silicon-On-Nothing, SON, processing sequence. The SON processing sequence may include forming one or more trench structures in the semiconductor substrate, annealing the trench structures in a deoxidizing ambient, and obtaining the cavity below the sensor portion from the annealed trench structures.

In some embodiments, forming the suspension portion comprises forming a single suspension strip of semiconductor material integrally (monolithically) interconnecting the semiconductor substrate and the sensor portion thereof.

In some embodiments, the method further comprises forming, in the semiconductor substrate, a frame structure surrounding the sensor portion of the semiconductor substrate, and suspending the frame structure in the cavity by integrally (monolithically) interconnecting the semiconductor substrate, the sensor portion, and the frame structure via the suspension portion of the semiconductor substrate.

In some embodiments, forming the suspension portion comprises at least partially coating the suspension portion with a stress layer to apply a biasing stress or strain to the flexibly suspended sensor portion of semiconductor material.

According to yet a further aspect, the present disclosure also provides a method for manufacturing an integrated semiconductor device. The method includes forming a cavity into a semiconductor substrate. The cavity comprises a bottom, a cover, and sidewalls extending from the bottom to the cover. A respective sidewall comprises a curved transition from the sidewall to the cover. The method further includes forming a trench which tangentially extends to the curved transition of the sidewalls to transform the cover of the cavity into a sensor portion of the semiconductor substrate which is deflectably suspended in the cavity via a remaining suspension portion of the semiconductor substrate interconnecting the semiconductor substrate and the sensor portion.

In some embodiments, the cavity can be formed using an Empty-Space-in-Silicon (ESS) technique.

In some embodiments, forming the trench includes generating an anti-sticking structure from the curved transition at the end of the sensor portion facing the trench.

Embodiments of the present disclosure can be used for implementing MEMS devices, such as MEMS microphones, pressure sensors, or accelerometers, for example. Due to the suspension of the sensor portion at only one side of the cavity, the sensor portion of the integrated semiconductor device can be made substantially independent of stress applied to the semiconductor substrate and/or a housing and further undesired external mechanical influences. Furthermore, due to the sensor portion being suspended in the cavity, frontend-of-line structures having low thickness or height become possible.

BRIEF DESCRIPTION OF THE DRAWINGS

Some embodiments of apparatuses and/or methods will be described in the following by way of example only, and with reference to the accompanying figures, in which.

DETAILED DESCRIPTION

Figure 1:
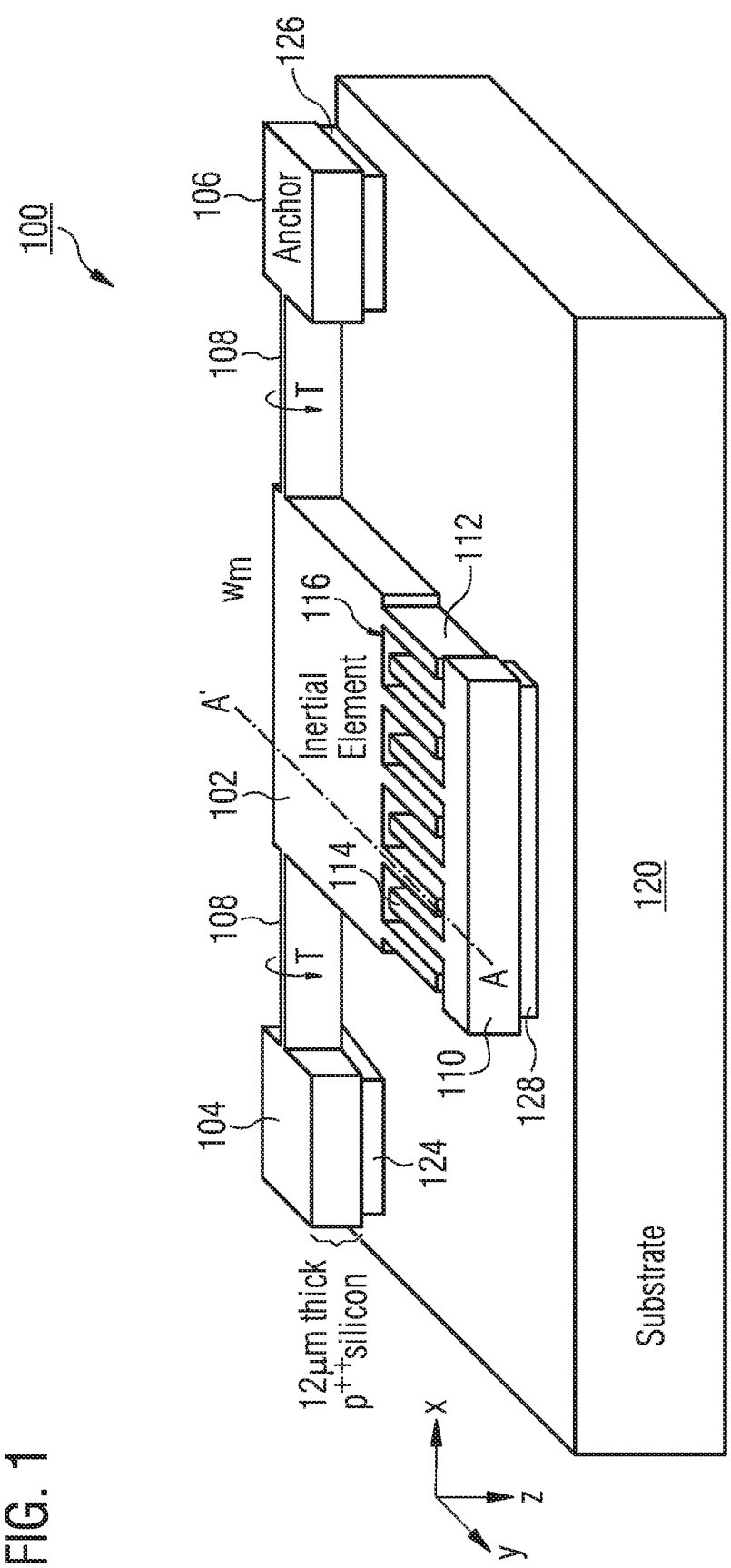
FIG. 1 shows a perspective view of a conventional out-of-plane comb drive accelerometer.

Various example embodiments will now be described more fully with reference to the accompanying drawings in which some example embodiments are illustrated. In the figures, the thicknesses of lines, layers and/or regions may be exaggerated for clarity.

Accordingly, while further embodiments are capable of various modifications and alternative forms, some example embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of further example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art, unless expressly defined otherwise herein.

In the following, example embodiments related to acceleration sensors (also referred to as accelerometers) will be described in more detail. The skilled person having benefit from the present disclosure will appreciate however that the principles of the present disclosure are not limited to accelerometers but are also applicable to other kinds of sensors using mechanically deflectable sensor portions, such as pressure sensors or microphones, for example.

Conventional accelerometers operate with a polycrystalline silicon lamination provided on top of a silicon substrate, for example. Here, layers having thicknesses of typically 5-10 μm are used as the basis of a discrete sensor component. However, in this form of structuring the layers are not integrable in a conventional CMOS process.

To illustrate the working principle of capacitive accelerometers, FIG. 1 shows a perspective view of a conventional out-of-plane comb drive accelerometer 100.

The example comb drive accelerometer 100 includes a proof mass or seismic mass 102, first and second anchors 104 and 106, suspension strips or flexures 108, a stator 110, a row of rotor tines or sense fingers 112, and a row of stator tines 114. The comb drive 100 may be fabricated using conventional MEMS technologies.

The proof mass 102 is suspended above a substrate 120, which can be a semiconductor substrate, so that the proof mass 102 is free to rotate about an axis of rotation (in x-direction) along the flexures 108. The proof mass 102 is suspended by the flexures 108 from two suspension points formed by the first anchor 104 and the second anchor 106. The first anchor 104 and the second anchor 106 are bonded to the substrate 120 using respective support posts 124 and 126. The flexures 108 substantially limit movement of the proof mass 102 in the x- and y-axes, yet permit rotation in the z direction (about the y axis) in response to an out-of-plane acceleration (out of the x-y plane).

The plurality of rotor comb tines 112 are formed along a first end of the proof mass 102. Additional symmetrically arranged rotor comb tines can also be formed along an opposing second end of the proof mass 102 (not shown in FIG. 1). For illustrative purposes, five rotor comb tines 112 are illustrated, but in practice many more rotor comb tines 112 would be used.

The stator 110 comprises a row of stator comb tines 114 complementary to the rotor comb tines 112. Additional symmetrically arranged stator comb tines could also be formed proximate to rotor comb tines at the opposing second end of the proof mass 102 (not shown in FIG. 1). For illustrative purposes, only four stator comb tines 114 shown. In practice many stator comb tines would be used.

In the illustrated example, the stator 110 is bonded to the substrate 120 using support post 128 such that stator comb tines 114 are held in a fixed position relative to the rotor tines 112. The stator comb tines 114 interleave with the rotor comb tines 112 with a gap 116 separating the stator comb tines 114 from the rotor comb tines 112. The gap 116 provides at least two functions. First, the gap 116 eliminates frictional contact between adjacent stator and rotor comb tines so that the proof mass 102 is free to rotate about its rotation axis in response to accelerations along the z axis. Second, the separation between adjacent stator and rotor comb tines defined by the gap 116 allows a capacitance to exist when a potential difference is applied across the stator comb tines 114 and the rotor comb tines 112.

The capacitance across the gap 116 is a function of the area of overlap between the opposing faces of the rotor and stator tines 112, 114. Because the proof mass 102 can rotate in response to accelerations along the z axis, the area of overlap in the rotor and stator tines 112, 114 can vary. As the area of overlap varies (in z-direction), so does the value of the capacitance across the gap 116. For example, measurement of this capacitive value may be used in a feedback loop to determine the level of voltage to apply to the rotor and stator tines 112, 114 to maintain the proof mass 104 in an approximately fixed position.

In the conventional example of FIG. 1, the proof mass (or seismic mass) 102, the first and second anchors 104 and 106, the flexures 108, the stator 110, the rotor tines 112, and the stator tines 114 are all formed from an additional polycrystalline silicon (polysilicon) layer provided on top of the silicon substrate 120. For example, said polysilicon layer may have a thickness/height of 12 μm or more in some examples. As has been explained above, the topology of frontend-of-line structures plays an important role for sub 130 nm process technologies employed to date. They should not exceed a total thickness of a few hundred nanometers, so as not to interfere a potential Borophosphosilicate glass (BPSG) polishing act.

Further, if mechanical stress is applied to the substrate 120, the stress may disadvantageously be transferred to the proof mass 102 and/or the stator 110, i.e., the capacitor elements. Such mechanical stress may even lead to frictional contact between adjacent stator and rotor comb tines so that the proof mass 102 cannot freely rotate.

Embodiments of the present disclosure, which will be explained in the sequel, address these disadvantageous issues of conventional MEMS accelerometers.

Figure 2A:
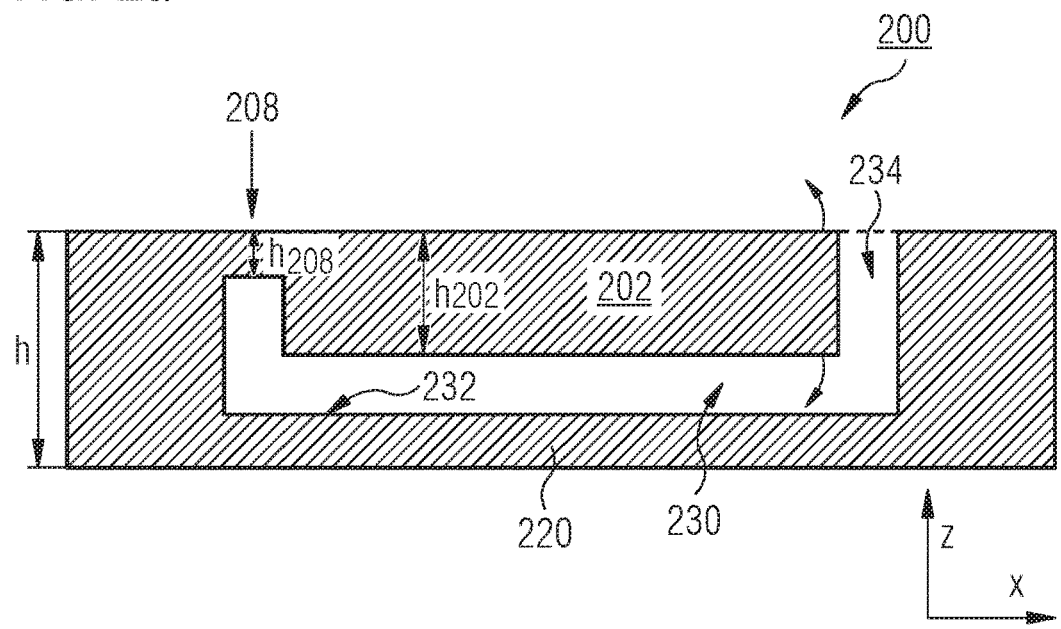
FIG. 2*a, b* illustrate different views of an integrated semiconductor device according to an example embodiment.

FIG. 2a illustrates a cross-sectional view of an integrated semiconductor-based sensor device 200 according to an example embodiment.

Figure 2B:
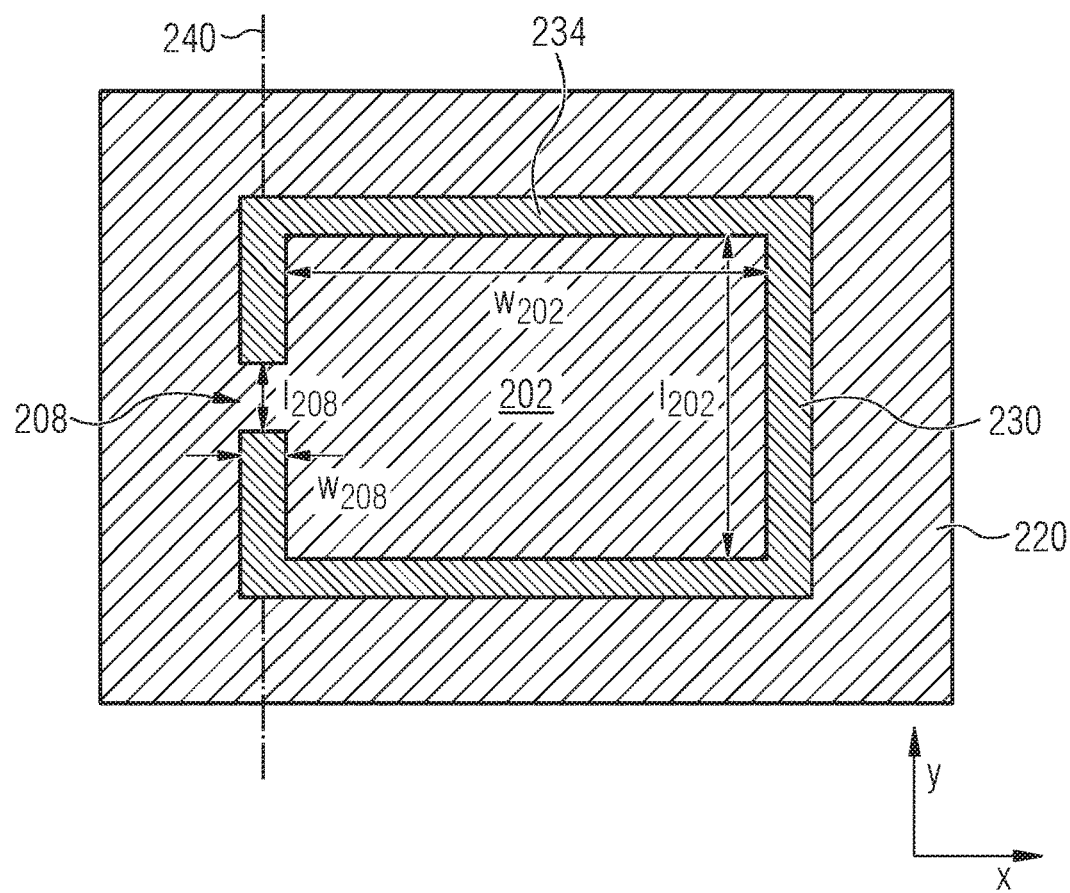

The integrated semiconductor device 200 comprises a semiconductor substrate 220, such as a semiconductor wafer, for example. The semiconductor substrate 220 is made of semiconductor material, such as Silicon (Si) or Germanium (Ge), for example. The substrate 220 may be at least partially doped. The semiconductor substrate 220 comprises a cavity 230 formed into the semiconductor substrate 220. The semiconductor substrate 220 also comprises a sensor portion 202 formed into the semiconductor substrate 220, wherein the sensor portion 202 is deflectably suspended in the cavity 230 at one side of the cavity via a suspension portion 208 of the semiconductor substrate. In the illustrated example of FIG. 2a, the suspension portion 208 is located on the left side of the cavity 230. However, the skilled person having benefit from the present disclosure will appreciate that the suspension portion 208 could be located on any side of the cavity 230. The suspension portion 208 interconnects the semiconductor substrate 220 and the sensor portion 202 thereof. An extension $l_{208}$ of the suspension portion 208 along the (e.g. left) side of the cavity 230 is smaller than an extension of said side of the cavity. This can be better seen in the top view of FIG. 2b. Likewise, the extension $l_{208}$ of the suspension portion 208 along the side of the cavity (in y-direction) may also be smaller than an extension of the sensor portion 202 along said side of the cavity. Such dimensions allow for stability and flexibility of the suspension portion 208 at the same time.

In the illustrated example, the cavity 230 extends below the sensor portion 202 and has a bottom 232 formed by the bulk semiconductor substrate 220. Note, however, that the bottom 232 is optional and may be omitted in other embodiments. In such cases the cavity 230 compares to a hole formed in the semiconductor substrate 220 and reaching through from a top surface to a bottom surface of the substrate 220. For example, an amplitude of the sensor portion's deflection may be increased without the bottom 232.

As can be seen from FIG. 2a, a thickness or height h of the example integrated semiconductor device 200 corresponds to a thickness/height of the bulk semiconductor substrate 220. In contrast to the conventional setup of FIG. 1, no additional layers are required on top of the bulk substrate 220. According to embodiments, a top surface of the sensor portion 202 may be located even below or at least coplanar with a top surface of the bulk semiconductor substrate 220. Likewise, a top surface of the suspension portion 208 may be located below or coplanar with the top surface of the semiconductor substrate 220. In the illustrated example, the top surfaces of the semiconductor substrate 220, the suspension portion 208 thereof, and the sensor portion 202 thereof are coplanar. This may enable small heights/thicknesses of resulting frontend-of-line structures.

Vertical sidewalls of the cavity 230 and vertical sidewalls of the sensor portion 202 suspended therein are separated by a gap 234. Also here the gap 234 may provide at least two functions. First, the gap 234 may eliminate frictional contact between adjacent sidewalls of the cavity 230 and the sensor portion 202 so that the sensor portion 202 is free to move about its deflection axis in response to excitations along the z axis. Second, the separation between adjacent sidewalls of the cavity 230 and sidewalls of the sensor portion 202 defined by the gap 234 allows a capacitance to exist when a potential difference is applied across the gap 234. Hence, the integrated semiconductor device 200 can be used for capacitive sensing purposes, for example. Such sensors include, among others, capacitive MEMS microphones, capacitive MEMS pressure sensors, or MEMS accelerometers.

The sensor portion 202 of the semiconductor substrate 220 is suspended in the cavity 230 so that the sensor portion 202 is free to get mechanically deflected about an axis 240 (in y-direction) along the flexible suspension portion 208. The sensor portion 202 is suspended using the suspension portion 208 protruding from the substrate 220 at substantially one suspension point at one side of the cavity 230. In some embodiments, the suspension portion 208 may be implemented as a single strip or bar of semiconductor material integrally or continuously or monolithically interconnecting the semiconductor substrate 220 and the sensor portion 202 thereof. Further, the suspension portion 208 may be dimensioned to substantially limit movement of the sensor portion 202 in direction of the x- and y-axes, yet permit deflection in the z direction (about the y axis) in response to an out-of-plane excitation (out of the x-y plane). In other words, the sensor portion 202 of semiconductor substrate 220 may be configured for an out-of-plane deflection (e.g. normal to the substrate surface) relative to the semiconductor substrate 220 in response to an out-of-plane excitation applied to the integrated semiconductor device 200.

In the example embodiment of FIGS. 2a, b, the sensor portion 202 and the suspension portion 208 both are continuous portions of the bulk semiconductor substrate 220. This means that the sensor portion 202, the suspension portion 208, and the remaining semiconductor substrate 220 are monolithically integrated and form one continuous piece of semiconductor material.

In some embodiments, the sensor portion 202 of the semiconductor substrate may have a width $w_{202}$ of more than 100 μm and a length $l_{202}$ of more than 100 μm, leading to a surface area of more than 100 μm×100 μm, while the length $l_{208}$ and width $w_{208}$ of the suspension portion 208 may be much smaller, respectively. For example, $l_{208}/l_{202}$ may be smaller than ⅕ or even smaller than ¹/₁₀. Likewise, $w_{208}/w_{202}$ may be smaller than ⅕ or even smaller than ¹/₁₀. Consequently, a surface area of the suspension portion 208 may be not more than 10 μm×10 μm in some embodiments. A thickness or height $h_{208}$ of the suspension portion 208 may be equal to or smaller than a thickness or height $h_{202}$ of the sensor portion 202 or the semiconductor substrate.

In some embodiments related to microphones or pressure sensors, the sensor portion 202 of the semiconductor substrate 220 may act as a membrane configured for an out-of-plane oscillation in response to an out-of-plane pressure applied to the integrated semiconductor device. In other embodiments, which will be described in more detail, the integrated semiconductor device 200 may be an accelerometer, for example. In this case the sensor portion 202 of the semiconductor substrate constitutes a seismic or proof mass configured for an out-of-plane movement in response to an out-of-plane acceleration of the integrated semiconductor device 200.

Figure 3A:
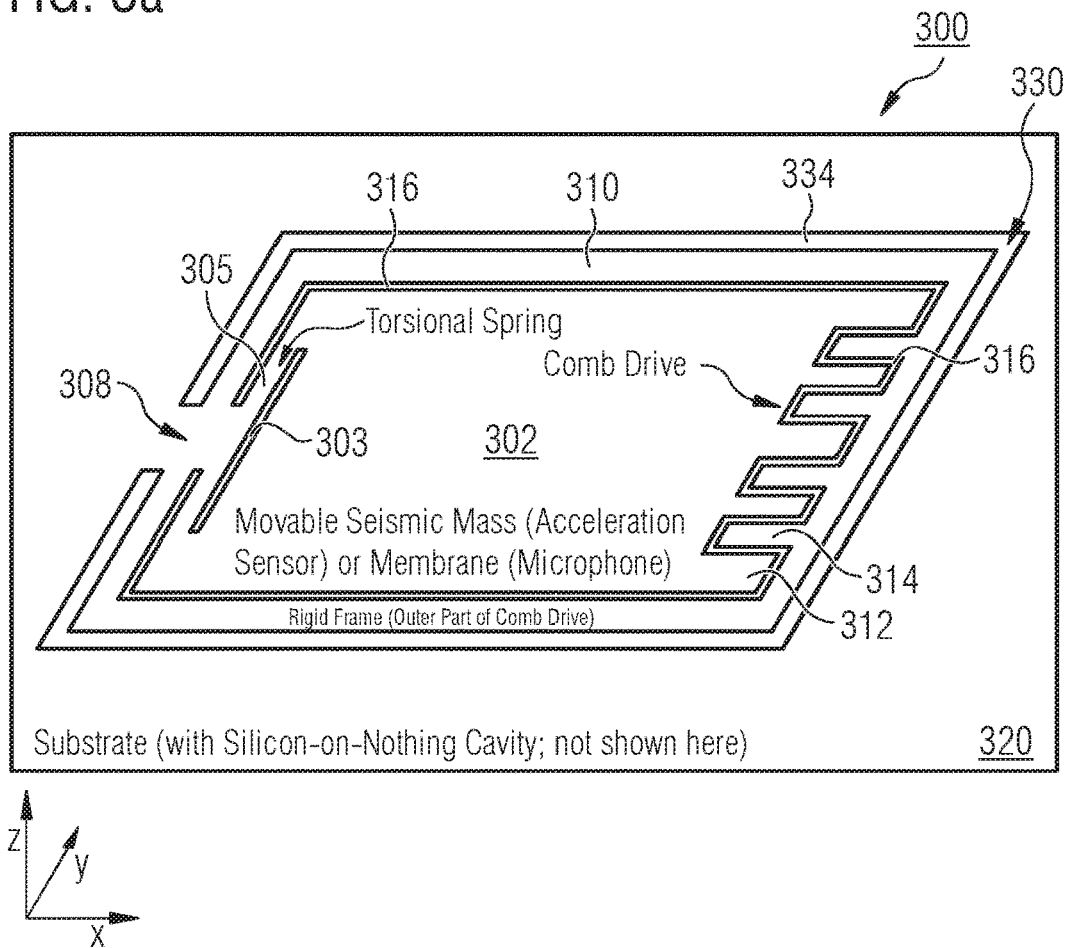
FIG. 3*a, b* illustrate different views of an integrated comb drive accelerometer according to an example embodiment.

Turning now to FIG. 3a, it is shown a perspective view of an out-of-plane comb drive accelerometer 300 according to an embodiment.

The example comb drive accelerometer 100 includes an acceleration sensitive proof mass 302 suspended in a cavity 330, which is formed in a bulk semiconductor substrate body 320. The comb drive accelerometer 300 further includes a thin suspension portion (suspension strip/suspension bar) 308, a rigid stator frame 310, a row of rotor tines or sense fingers 312 formed into the proof mass 302, and a row of stator tines 314 formed into the stator frame 310. As will be explained below, the comb drive 300 may be fabricated using Silicon-On-Nothing (SON) process steps. Note that the proof mass 302, the suspension strip/bar 308, and the stator frame 310 are all obtained from the same bulk semiconductor material. That is, the bulk semiconductor substrate body 320, the proof mass 302, the suspension bar 308, and the stator frame 310 are one continuous piece of semiconductor material.

The acceleration sensitive proof mass 302 is suspended in the cavity 330, so that the proof mass 302 is free to swing about an axis (in y-direction) along the left side of cavity 330. The proof mass 302 is suspended at the semiconductor substrate body 320 via the suspension bar 308 at precisely one suspension point located where the suspension bar 308 continuously merges into the bulk semiconductor substrate 320. The suspension bar 308 substantially limits movement of the proof mass 302 in the x- and y-direction, yet permits deflection in the z direction (about the y axis) in response to an out-of-plane acceleration (out of the x-y plane). Deflection may be further improved by an optional trench 303 formed into the proof mass 302 at an end of the proof mass 302 continuously merging into the suspension bar 308. The trench 303 may be obtained by using conventional deep trench etching processing technology, for example. The trench 303 extends substantially parallel to an edge of the proof mass portion 302 facing the suspension bar portion 308 of the semiconductor substrate. A distance d between the trench 303 and the edge may be less than 20 µm or less than 10 µm, hence leaving thin strips/bars 305 of semiconductor material of less than 20 µm or less than 10 µm width in x-direction between gap 316 and trench 303. Those bars 305 of semiconductor material act as a torsional spring allowing for better deflection in z-direction.

The rigid stator frame 310 is also monolithically formed into or from the semiconductor substrate 320 and surrounds the deflectable proof mass 302 of semiconductor material. Via the suspension bar 308 the stator frame 310 is suspended in the cavity 330 laterally between an edge of the proof mass 302 and an edge of the cavity 330. The stator frame 310 and the proof mass portion 302 are separated by a first gap 316. The stator frame 310 and the edge/sidewall of the cavity are separated by a second gap 334.

The proof mass 302, the stator frame 310, and the semiconductor substrate 320 are integrally or monolithically formed from one piece of semiconductor material. The proof mass 302 and the stator frame 310 are suspended in the cavity 330 via suspension bar or strip 308, which is a common single suspension portion of the semiconductor substrate 320 integrally or continuously interconnecting the semiconductor substrate 320, the stator frame 310, and the proof mass portion 302 of the semiconductor substrate.

To increase a capacitance, the proof mass 302 comprises a first electrode with a plurality of rotor comb tines 312 formed into at least one edge of the proof mass. The rigid stator frame 310 comprises a second electrode with a plurality of stator comb tines 314 arranged interleaved with the first plurality of comb tines 312. The plurality of rotor comb tines 312 are formed along a first (right) end of the proof mass 102 opposed to suspension bar 308. Additional rotor comb tines can also be formed along the lower and/or upper ends of the proof mass 302 (not shown in FIG. 3a). For illustrative purposes, five rotor comb tines 312 are illustrated, but in practice many more rotor comb tines 312 would be used. Correspondingly, additional arranged stator comb tines could also be formed proximate to rotor comb tines at the lower and/or upper ends of the proof mass 302 (not shown in FIG. 3a). For illustrative purposes, only four stator comb tines 314 shown. In practice many stator comb tines would be used.

In the illustrated example, the stator frame 310 is fixed to the substrate 320 using suspension bar 308 such that stator comb tines 314 are held in a fixed position relative to the rotor tines 312. The stator comb tines 314 interleave with the rotor comb tines 312 with a gap 316 separating the stator comb tines 314 from the rotor comb tines 312. The gap 316 provides at least two functions. First, the gap 316 eliminates frictional contact between adjacent stator and rotor comb tines so that the proof mass 302 is free to rotate about its rotation axis in response to accelerations along the z axis. Second, the separation between adjacent stator and rotor comb tines defined by the gap 316 allows a capacitance to exist when a potential difference is applied across the stator comb tines 314 and the rotor comb tines 312. The electrode structures may be created with a proven carbon sacrificial layer process, for example.

The capacitance across gap 316 is a function of the area of overlap between the opposing faces of the rotor and stator tines 312, 314. Because the proof mass 302 can deflect in response to accelerations along the z axis, the area of overlap in the rotor and stator tines 312, 314 can vary. As the area of overlap varies, so does the value of the capacitance across the gap 316. For example, measurement of this capacitive value may be used in a feedback loop to determine the level of voltage to apply to the rotor and stator tines 312, 314 to maintain the proof mass 302 in an approximately fixed position.

The second gap 334 between stator frame 310 and sidewalls of the cavity 330 in conjunction with the single suspension bar 308 decouples the stator frame 310 and the proof mass 302 from the remaining semiconductor substrate 320 such that mechanical stress applied to the semiconductor substrate 320 can be decoupled from the stator frame 310 and the proof mass 302.

Figure 3B:
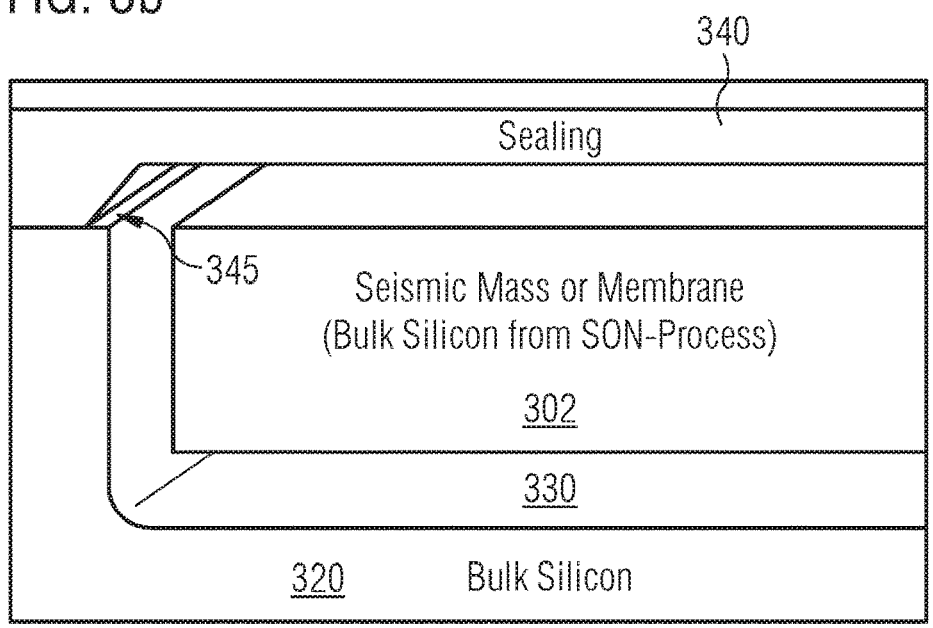

FIG. 3b illustrates an enlarged cross-sectional view of the out-of-plane comb drive accelerometer 300.

Here, the comb drive accelerometer 300 comprises an optional sealing layer 340 covering at least the deflectable proof mass 302, which is suspended in the cavity 330. Here, the sealing layer 340 comprises a protrusion or chamber 345 allowing the proof mass 302 to swing in and out the cavity 330. The sealing layer 340 may comprise various sealing materials, such as thermoplastic, elastomeric or metallic materials, for example. Here, silicon oxide, silicon nitride or polysilicon layers are appropriate candidates as well.

In particular, the portions of the cavity 330 extending laterally underneath the proof mass portion 302 of the bulk silicon may be obtained using Silicon-On-Nothing (SON) process techniques. Vertical portions of the cavity 330 extending vertically between the bulk substrate 320 and the proof mass portion 302 may be obtained using conventional deep trench etching techniques, for example, and may be synergistically combined with forming other similar structures in the semiconductor device 300, such as trenches, transistors or capacitors, for example.

Figure 4:
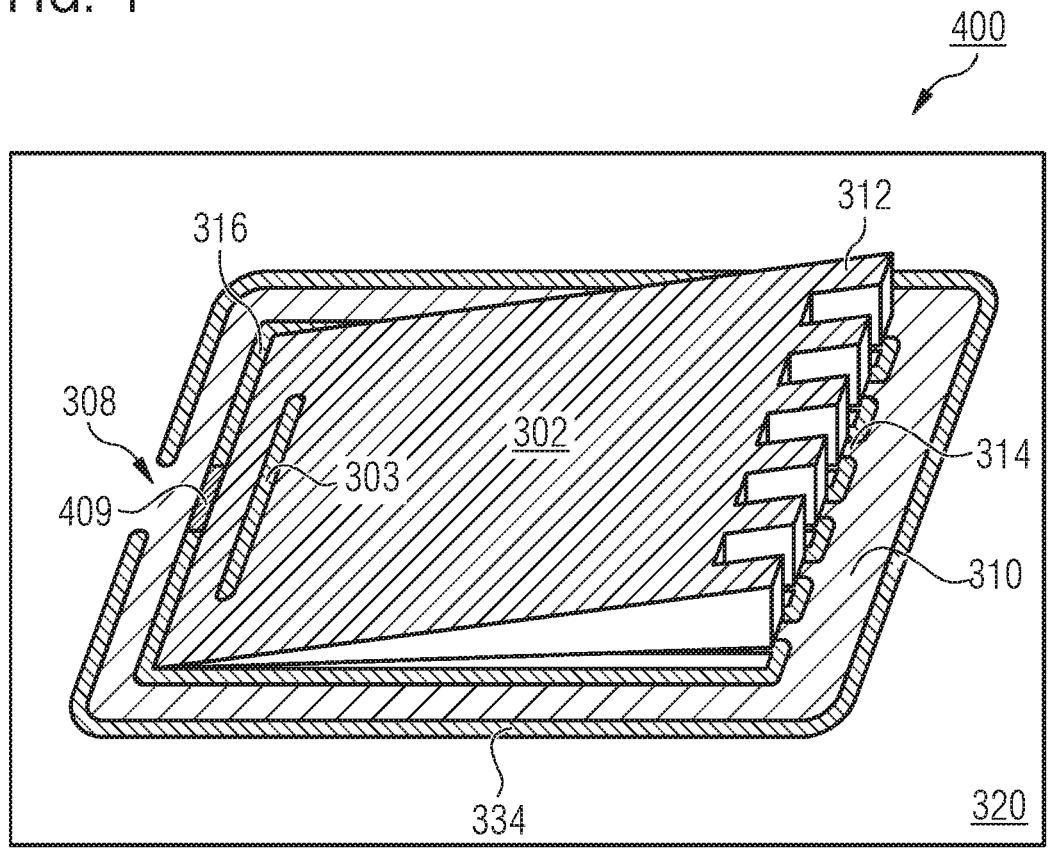
FIG. 4 shows a biased integrated comb drive accelerometer according to an example embodiment.

Turning now to FIG. 4, an embodiment of a biased comb drive accelerometer 400 is illustrated. For the sake of brevity a detailed description of like or similar elements that have been described before will be omitted.

Here, the suspension bar 308 is at least partially coated with a stress layer 409 configured to apply a tensile or compressive stress or strain offset to the proof mass 302. The stress layer 409 may comprise a material with different (larger or smaller) a lattice constant than that of the substrate's semiconductor material (for example Silicon, Si). An example material for the stress layer would be silicon nitride ($Si_3N_4$). In this way the accelerometer 400 may be biased in a specific direction.

Figure 5:
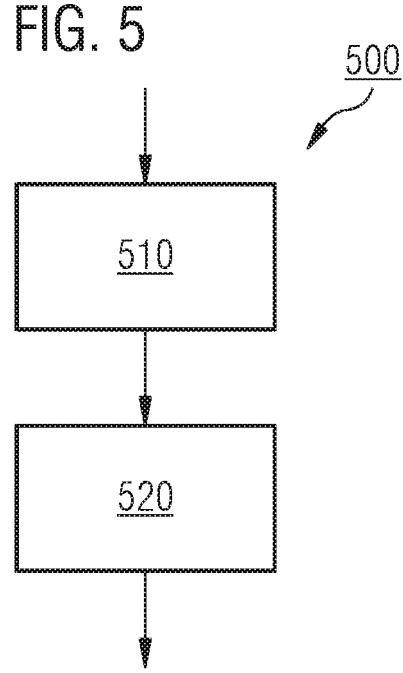
FIG. 5 illustrates a high-level flowchart of a method for manufacturing integrated semiconductor device according to an embodiment.

As schematically shown by FIG. 5, embodiments also provide a method 500 for manufacturing an integrated semiconductor device according to embodiments.

Method 500 includes forming 510, in a semiconductor substrate 220, 320, a cavity 230, 330 extending below a sensor portion 202, 302 of the semiconductor substrate. Further, method 500 includes forming 520, at one side of the cavity 230, 330, a suspension portion 208, 308 of the semiconductor substrate deflectably suspending the sensor portion 202, 302 in the cavity, such that an extension of the suspension portion 208, 308 along the side of the cavity is smaller than an extension of said side of the cavity.

Some embodiments use a so-called Silicon-On-Nothing (SON) processing sequence to form the cavity 230, 330 or at least portions thereof and/or to provide further basic structural elements of the integrated semiconductor device 200, 300, 400. In other words, the cavity 230, 330 between the substrate 220, 320 and the sensor portion 202, 302 may be provided by applying a SON processing sequence, an example of which will be explained in more detail below.

A practical method for obtaining SON structures with a desired size and shape may use the so-called Empty-Space-in-Silicon (ESS) formation technique. It has been shown that a SON structure can be precisely controlled by the initial shape and layout of trenches. The size of ESS is determined by the size of the initial trench(es). The desired shapes of ESS, such as spherical, pipe-shaped and plate-shaped, can be fabricated by changing the arrangement of the initial trenches. Some examples of SON processing make use of the self-organizing recrystallization caused by silicon surface migration. The initial trench shape patterned on the silicon substrate may be regarded as the most important factor to fabricate a SON structure. The trench structure transforms so as to minimize the surface energy, when it is annealed in a deoxidizing ambient, such as hydrogen.

Figure 6:
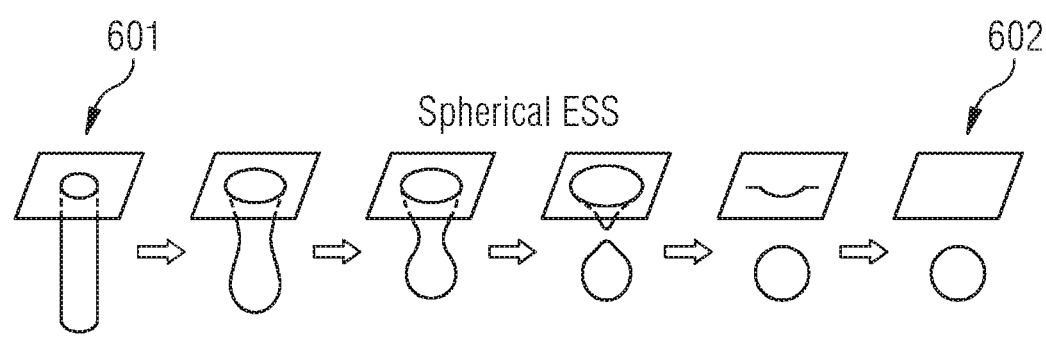
FIG. 6 shows various principles of forming Silicon-On-Nothing (SON) cavities.
Figure 6:
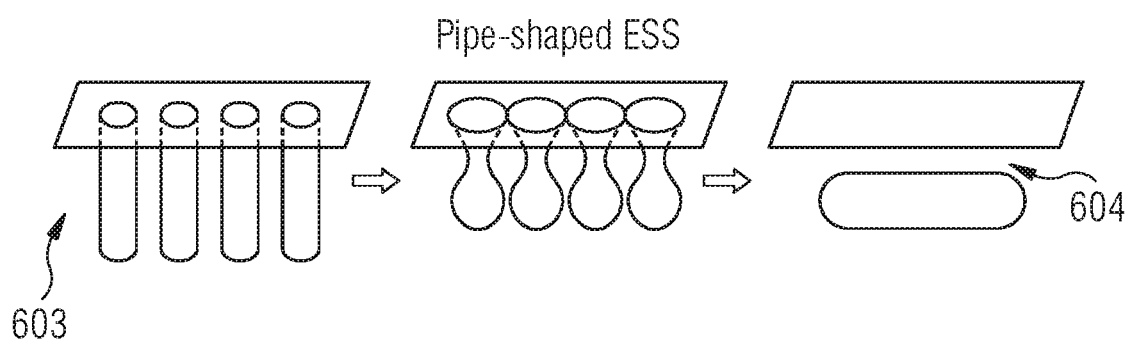
Figure 6:
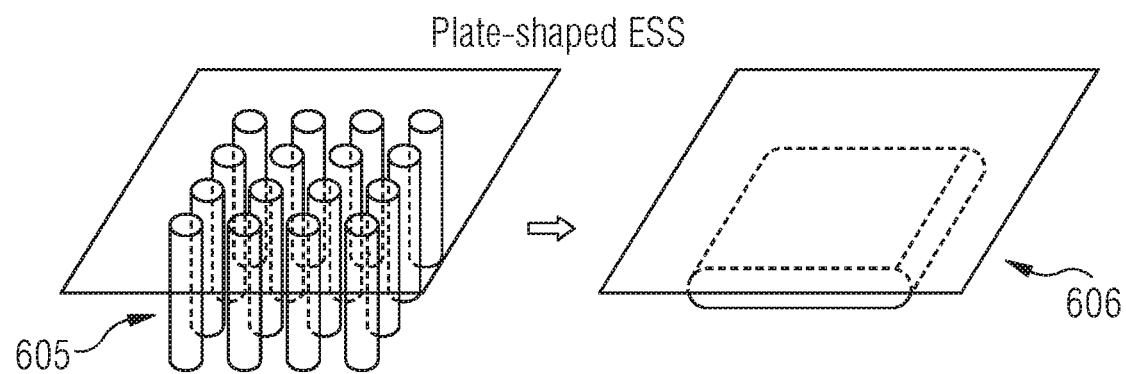

Trench transformation by surface migration results in the Empty-Space-in-Silicon (ESS). The SON structure can be made of SON sheet layer over ESS by this means. Typical examples of ESS formation, whose shapes are spherical, pipe-shaped and plate-shaped, are schematically illustrated in FIG. 6.

Figure 7:
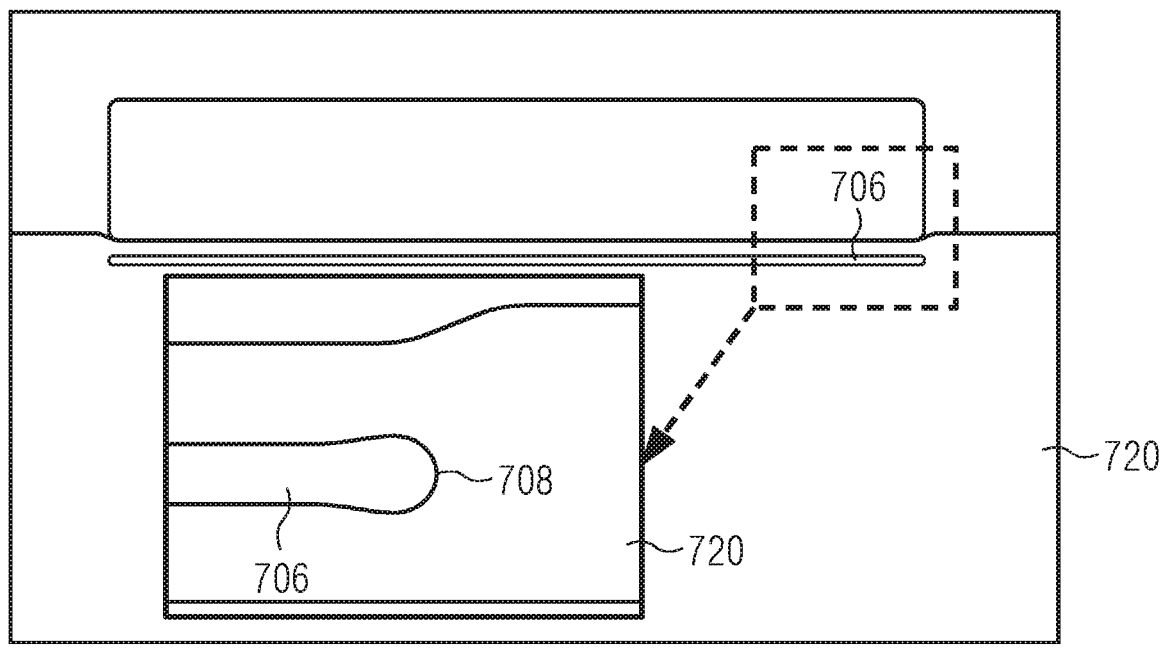
FIG. 7 shows and example of a silicon-on-nothing structure.

An isolated deep trench 601 may be transformed to a spherical ESS 602, see FIG. 6a. Formation of the spherical ESS begins at the top and bottom corners of the deep trench, because the radius of curvature of these regions is the smallest. This result indicates that the diameter of the spherical ESS becomes larger than that of the initial trench. Thus, trenches 603 closely arranged in a row are transformed to the pipe-shaped ESS 604, due to the combination of the grown spherical ESS at the bottom of each trench, see FIG. 6b. A plate-shaped ESS 606 can also be fabricated by developing this technique. By arranging the trenches in a lattice 605, the spherical ESSs at the bottom of all trenches are combined, and they are transformed to a large, thin plate-shaped ESS 606, see FIG. 6c. In particular, the technique of FIG. 6c may be used for obtaining a SON cavity below the sensor portion 202, 302, for example. An example of a plate-shaped ESS 706 structure embedded in a semiconductor substrate 720 is shown in FIG. 7, also illustrating an enlarged view of the ESS 706 structure. It can be seen that the ESS 706 structure comprises rounded edges or corners 708 that are formed during the annealing process.

The ESS technique offers a wide range of chances and opportunities to design and fabricate new devices for micromechanical, optical and sensor applications. However, concerning process capability and robustness at application, parallel plate configurations may not always be favorable. Sticking or lamella breakage may occur—especially, when deflection due to external forces or internal stress leads to a touching of two adjacent surfaces.

Figure 8:
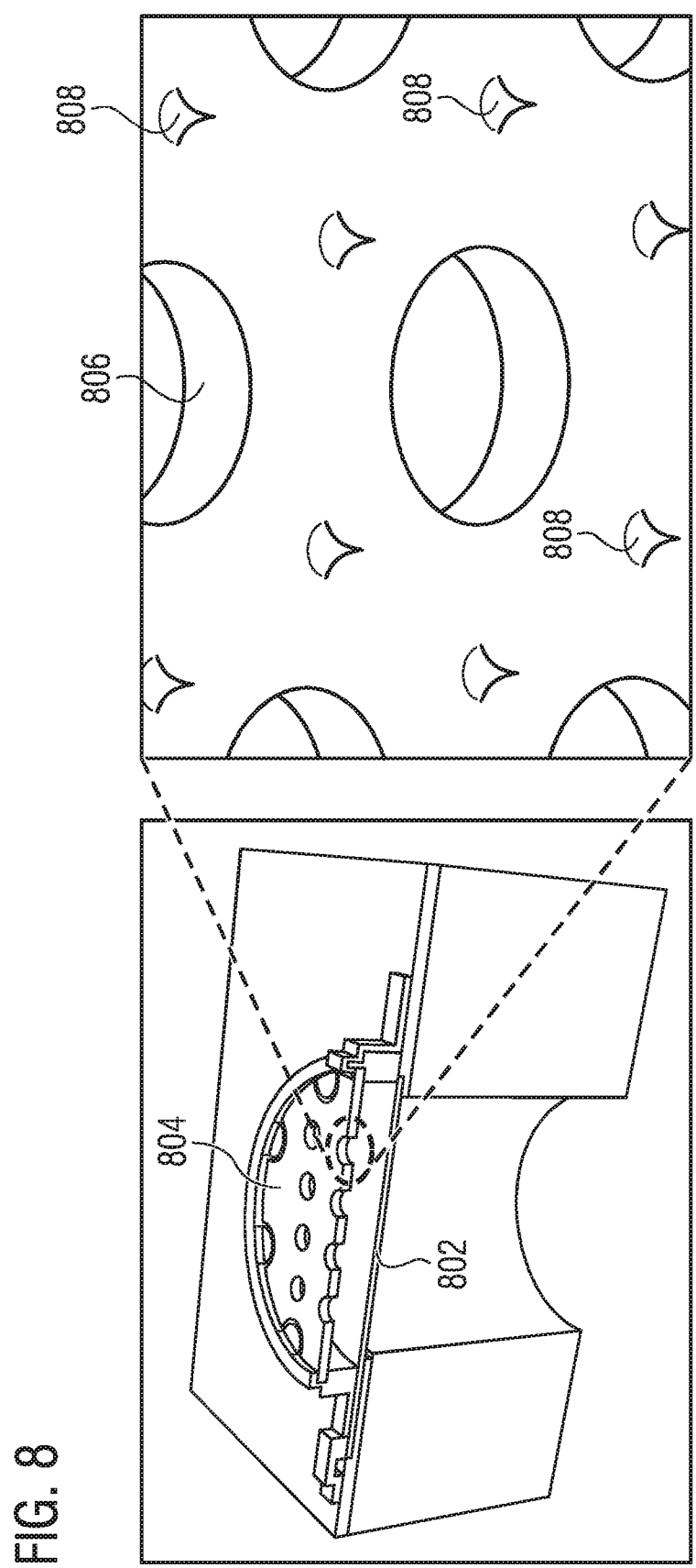
FIG. 8 shows anti-sticking bumps at a silicon microphone.

Such situations can occur in acceleration sensors or silicon microphones, for example. Therefore, a structuring process can be used to form bump structures, which can be formed in a way that a minimum contact area ensures a detaching when restoring forces act. An example related to a MEMS microphone 800 is shown in FIG. 8.

The MEMS microphone 800 comprises a membrane 802 and a back plate 804. As can be seen from the enlarged portion on the right of FIG. 8, the back plate 804 also comprises, beside perforation holes 806, anti-sticking or stop bumps 806 facing the membrane 802 to prevent in-use sticking.

Figure 9:
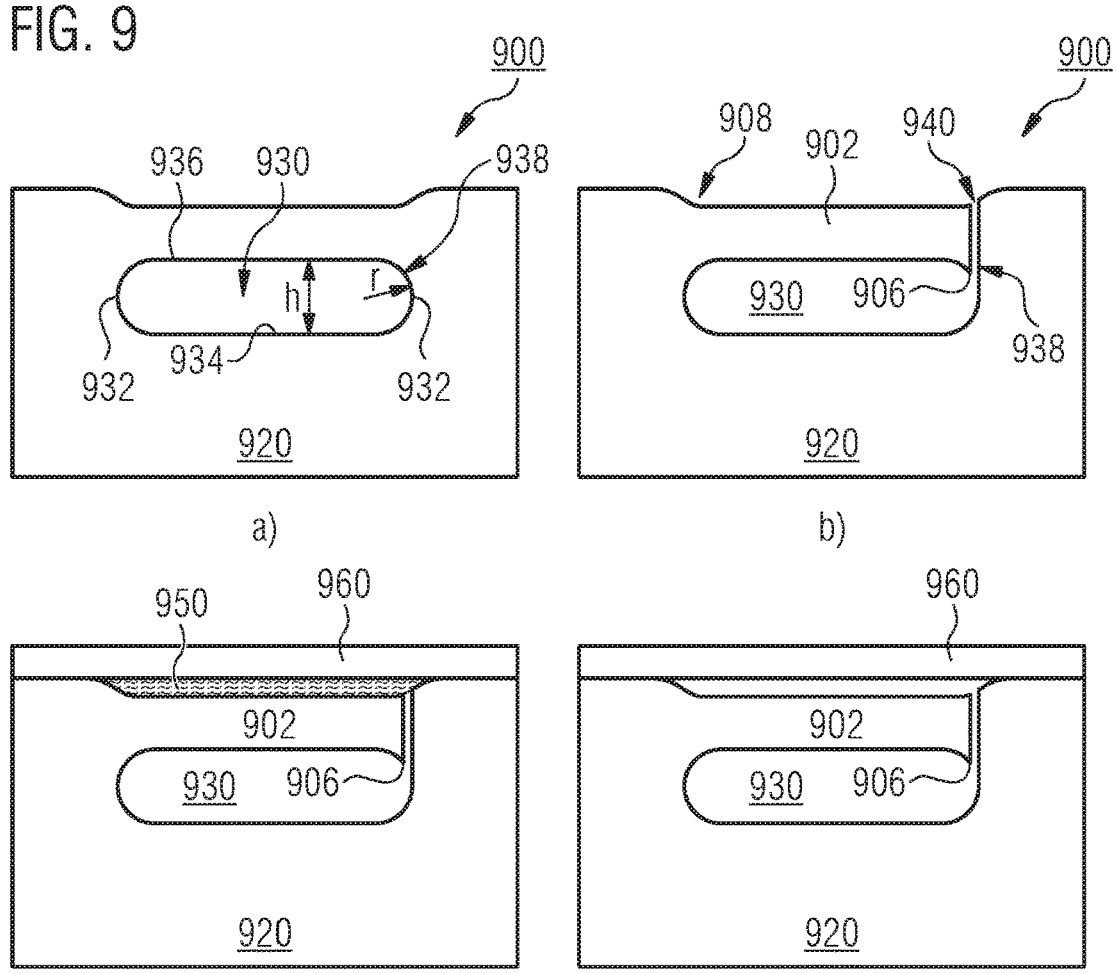
FIG. 9 illustrates an example process of for formation of MEMS elements with anti-sticking lines.

Some examples of the present disclosure propose to use rounded or curved regions of a silicon-on-nothing cavity to form in-situ processed anti-sticking lines or bumps. One example semiconductor device 900 is illustrated in FIG. 9.

FIG. 9a shows a semiconductor substrate 920 comprising a SON cavity 930 formed into the semiconductor substrate 920, e.g., by using an ESS formation technique. The SON cavity 930 is delimited by sidewalls 932, a bottom portion 934, and a cover portion 936 of semiconductor substrate. Due to the ESS formation technique, the sidewalls 932 have curved transitions 938 toward the bottom portion 934 and the cover portion 936. Said differently, corner regions between the sidewalls 932 and the cover portion 936 or the bottom portion 934 are not rectangular but substantially curved or bent. A curvature radius r of the curved sidewalls 932 can be in the range of h/2, wherein h denotes a height of the cavity 930. A deflectable sensor portion 902 can be obtained from the cover portion 936 by separating the cover portion 936 from the semiconductor substrate 920 except leaving a suspension portion 908 of the semiconductor substrate integrally interconnecting the semiconductor substrate and the remaining sensor portion 902. For example, this separation or generation of the sensor portion 902 can be done by forming a vertically extending trench surrounding the sensor portion 902 except the suspension portion 908. In some examples, the vertical trench 940 can be formed as a tangent to the curved sidewalls 932. Thus, the trench 940 for separation of MEMS elements from the surrounding substrate 920 can be positioned at the edge of the rounded portion of the SON cavity 930. In this way, a portion of the curved corner regions 938 remains with the deflectable sensor portion 902 (former cover portion) as anti-sticking or stop bumps 906 at the end of the sensor portion 902 facing the trench or gap 940. In the illustrated example, the end of the sensor portion 902 facing the trench 940 has a trumpet-like cross section. That is to say, a thickness of the end of the sensor portion 902 facing the trench or gap 940 is larger than a thickness of the remaining deflectable sensor portion 902. For example, a ratio between the thickness of the end of the sensor portion 902 and the thickness of the remaining sensor portion 902 may be in the range from 1.01 to 1.2. Thus, an anti-sticking structure 906 can be generated at the end of the sensor portion 902 facing the trench or gap 940 using a suited separation of silicon-on-nothing structures. For example, this can be done by etching a separating trench 940 in the region of the curved edge of the SON cavity 930. FIG. 9c further illustrates providing a sacrificial layer 950 and a sealing layer 960 on top of the semiconductor substrate 920. Sacrificial layer 950 is removed in FIG. 9d.

Figure 10:
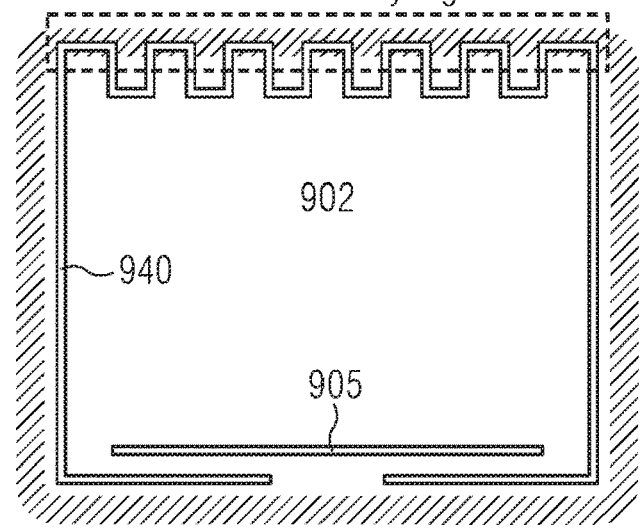
FIG. 10 shows a top view of an anti sticking structure produced in combination with a comb drive.

Some examples may also use a trench shape producing an interlaced comb-drive like structure. In this way, the contact region may be defined according to the mechanical needs (e.g. spring constant, etc.). Furthermore, the region may be used as a capacitive read out structure (comb drive). A top view such an example with bars 905 of semiconductor material acting as a torsional spring is shown in FIG. 10.

Thus, a method for manufacturing an integrated semiconductor device 900 is provided, wherein a cavity 930 is formed into a semiconductor substrate 920, for example using an Empty-Space-in-Silicon (ESS) technique. The cavity 930 comprises a bottom 934, a cover 936, and sidewalls 932. A respective sidewall 932 extends from the bottom 934 to the cover 936 and comprises (e.g. due to annealing) a curved transition (curved or bent corner) 938 from the sidewall 932 to the bottom 934 and/or to the cover 936. A trench 940 can be formed tangentially extending to the curved transition 938 of the sidewalls 932 in order to transform the cover 936 of the cavity 930 into a sensor portion 902 which is deflectably suspended in the cavity 930 via a remaining suspension portion 908 of the semiconductor substrate interconnecting the semiconductor substrate 920 and the sensor portion 902. Thereby, tangentially forming the trench 940 causes a portion of the curved transition 938 to become part of the deflectable sensor portion 902. Thus, the separated portion of the curved or rounded transition 938 forms an anti-sticking structure 906 at the end of the sensor portion 902 facing the trench 940.

To summarize, some embodiments propose integrating an acceleration sensor structure for measuring in the z-direction (normal to the substrate surface) into the substrate. For this purpose, a Silicon-On-Nothing technology may be used. A proposed variant uses a comb structure suspended on a frame for capacitive tapping. Both the acceleration sensitive element 302 and the frame/electrode 310 for signal tapping are hereby suspended from a common point, which may have a size less than 10 µm×10 µm. Thus seismic elements (or membranes) with an extension of 100 µm×100 µm or more are possible without generating an increased interaction with a housing. The geometry of the suspension enables a largely free design of spring elements and the seismic mass. A benefit of the proposed structure is, on the one hand, the ease of integration into a CMOS process. On the other hand, it provides a very good decoupling of an external stress entry and thus allows the use of low-cost housing options.

The fix or suspension point of the electrode on the mechanically rigid frame structure, the torsion spring and the entire frame structure can be defined with a single lithography and etching process. The support structure for the counter electrode on the seismic mass (or membrane) can take very diverse forms. In one embodiment, the frame and the seismic mass (or membrane) may be dielectrically isolated by an oxide layer. Electrical connections may also be made on the suspension portion.

Some embodiments use a combination of an SON structure (seismic mass) with a counter electrode, which is fixed to a point-like suspended supporting structure. In this way, the sensor element may be substantially independent of stress applied to the housing and further undesired mechanical influences. Furthermore, embodiments open up the possibility for monolithic integration of the sensor with an ASIC.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A method for manufacturing an integrated semiconductor device, comprising:
   forming, in a semiconductor substrate, a cavity extending below a sensor portion of the semiconductor substrate, wherein the cavity is delimited by the semiconductor substrate at sidewalls, a bottom portion and a cover portion of the cavity, wherein the cavity is closed within the semiconductor substrate below the sensor portion such that a main surface of the sensor portion horizontally intersects a vertical direction with the closed cavity; and
   forming, at one side of the cavity, a suspension portion of the semiconductor substrate deflectably suspending the sensor portion in the cavity, such that an extension of the suspension portion along the side of the cavity is smaller than an extension of said side of the cavity.

2. The method of claim 1, wherein forming the cavity comprises using a Silicon-On-Nothing, SON, processing sequence.

3. The method of claim 2, wherein the SON processing sequence comprises
forming one or more trench structures in the semiconductor substrate;
annealing the trench structures in a deoxidizing ambient; and
obtaining the cavity below the sensor portion from the annealed trench structures.

4. The method of claim 1, wherein forming the suspension portion comprises forming a single bar of semiconductor material integrally interconnecting the semiconductor substrate and the sensor portion thereof.

5. The method of claim 1, further comprising:
forming, in the semiconductor substrate, a frame structure surrounding the sensor portion of the semiconductor substrate, and
suspending the frame structure in the cavity by integrally interconnecting the semiconductor substrate, the sensor portion, and the frame structure via the suspension portion of the semiconductor substrate.

6. The method of claim 1, wherein forming the suspension portion comprises at least partially coating the suspension portion with a stress layer to apply a biasing stress or strain to the flexibly suspended sensor portion of semiconductor material.

7. A method for manufacturing an integrated semiconductor device, comprising:
forming a cavity into a semiconductor substrate, the cavity comprising a bottom, a cover, and sidewalls extending from the bottom to the cover, a respective sidewall comprising a curved transition from the sidewall to the cover;
forming a trench tangentially extending to the curved transition of the sidewalls to transform the cover of the cavity into a sensor portion of the semiconductor substrate deflectably suspended in the cavity via a remaining suspension portion of the semiconductor substrate interconnecting the semiconductor substrate and the sensor portion.

8. The method of claim 7, wherein the cavity is formed using an Empty-Space-in-Silicon, ESS, technique.

9. The method of claim 7, wherein forming the trench comprises generating an anti-sticking structure from the curved transition at the end of the sensor portion facing the trench.

10. A method of manufacturing a sensor structure, comprising:
forming a cavity in a substrate, the cavity having a top portion, a bottom portion and sidewalls delimited by the substrate; and
forming at one side of the cavity a suspension portion of the substrate, the suspension portion integrally connected to a sensor portion of the substrate above the cavity, wherein the cavity is closed within the substrate below the sensor portion such that a main surface of the sensor portion horizontally intersects a vertical direction with the closed cavity, and wherein the sensor portion is configured to deflect up and down about an axis defined by the suspension portion.

11. The method of claim 10, wherein the substrate comprises a semiconductor substrate.

12. The method of claim 10, wherein the cavity has a cavity length along a side thereof, and wherein the suspension portion has a suspension portion length that is smaller than the cavity length.

13. The method of claim 10, further comprising applying a biasing stress to at least a portion of the suspension portion.

14. The method of claim 13, wherein applying the biasing stress comprises at least partially coating the suspension portion with a stress layer.

15. The method of claim 10, further comprising:
forming a plurality of comb-like sensor portion tines in the sensor portion;
forming a plurality of comb-like substrate tines that alternate and interleave with the comb-like sensor portion tines,
wherein the comb-like sensor portion tines are opposite the one side of the cavity having the suspension portion.

16. The method of claim 11, wherein forming the cavity comprises
forming one or more trench structures in the semiconductor substrate;
annealing the trench structures in a deoxidizing ambient; and
obtaining the cavity below the sensor portion from the annealed trench structures.

17. The method of claim 16, wherein forming the suspension portion comprises forming a trench tangentially extending down to the sidewalls of the cavity to transform the substrate above the top portion of the cavity into the sensor portion.

18. The method of claim 17, wherein the obtaining of the cavity results in a curved surface at the sidewalls thereof, and wherein forming the trench comprises forming one or more ant-sticking structures from the curved surface at one or more positions along a periphery of the sensor portion.

19. The method of claim 11, further comprising:
forming, in the semiconductor substrate, a frame structure surrounding the sensor portion of the semiconductor substrate; and
suspending the frame structure in the cavity by integrally interconnecting the semiconductor substrate, the sensor portion, and the frame structure via the suspension portion of the semiconductor substrate.

* * * * *